US009793902B2

(12) United States Patent
Lakshmikumar et al.

(10) Patent No.: US 9,793,902 B2
(45) Date of Patent: Oct. 17, 2017

(54) REFERENCE-LESS CLOCK AND DATA RECOVERY CIRCUIT

(71) Applicant: Cisco Technology, Inc., San Jose, CA (US)

(72) Inventors: Kadaba Lakshmikumar, San Jose, CA (US); Mark Y. Tse, Basking Ridge, NJ (US); Bibhu Das, Richardson, TX (US); Bipin Dama, San Jose, CA (US)

(73) Assignee: Cisco Technology, Inc., San Jose, CA (US)

( * ) Notice: Subject to any disclaimer, the term of this patent is extended or adjusted under 35 U.S.C. 154(b) by 0 days.

(21) Appl. No.: 15/048,040

(22) Filed: Feb. 19, 2016

(65) Prior Publication Data
US 2017/0244416 A1 Aug. 24, 2017

(51) Int. Cl.
| | |
|---|---|
| *H03L 7/08* | (2006.01) |
| *H04L 7/033* | (2006.01) |
| *H03L 7/093* | (2006.01) |
| *H03L 7/089* | (2006.01) |
| *H03L 7/091* | (2006.01) |

(Continued)

(52) U.S. Cl.
CPC .......... *H03L 7/0807* (2013.01); *H03L 7/0891* (2013.01); *H03L 7/091* (2013.01); *H03L 7/093* (2013.01); *H03L 7/095* (2013.01); *H03L 7/113* (2013.01); *H04L 7/0331* (2013.01)

(58) Field of Classification Search
CPC ..... H03L 7/0807; H03L 7/0891; H03L 7/091; H03L 7/093; H03L 7/087; H03L 7/095; H03L 7/18; H03L 7/187; H03L 7/189; H03L 7/113; H04L 7/0331; H04L 7/02; H04L 7/009; H04L 7/0097

USPC .................. 375/355, 373, 374, 376; 398/155
See application file for complete search history.

(56) References Cited

U.S. PATENT DOCUMENTS

| | | | | |
|---|---|---|---|---|
| 4,571,572 A * | 2/1986 | Noda | ............... | G11B 20/00992 341/126 |
| 6,803,827 B1 * | 10/2004 | Kenney | .................. | H03L 7/107 331/1 A |
| 7,804,367 B2 * | 9/2010 | Lee | ......................... | H03L 7/087 327/156 |

OTHER PUBLICATIONS

Inti, Rajesh et al., A 0.5-to-2.5Gb/s Reference-less Half-Rate Digital CDR with Unlimited Frequency Acquisition Range and Improved Input Duty-Cycle Error Tolerance, IEEE Journal of Solid-State Circuits, Apr. 16, 2011, vol. 46, Issue 12, 38 pages, IEEE, Piscataway, United States.

(Continued)

*Primary Examiner* — Betsy Deppe
(74) *Attorney, Agent, or Firm* — Patterson + Sheridan, LLP (57) ABSTRACT

Embodiments herein describe a reference-less CDR circuit that receives electrical signals that may have been transmitted along either an electrical or optical interconnect which are then processed to identify the original data. To do so, the CDR circuit includes a frequency locking loop (FLL) and a phase locking loop (PLL) which generate control signals for a voltage controlled oscillator (VCO). In one embodiment, the FLL generates a coarse adjustment signal which the VCO uses to output a recovered clock that substantially matches the frequency of the received electrical signal. The PLL, on the other hand, generates a fine adjustment signal which the VCO uses to make small adjustments (e.g., half cycle phase shifts) to the recovered clock. The recovered clock outputted by the VCO is then fed back and used as an input in both the FLL and the PLL.

15 Claims, 6 Drawing Sheets

(51) Int. Cl.
H03L 7/095 (2006.01)
H03L 7/113 (2006.01)

(56) References Cited

OTHER PUBLICATIONS

Kratyuk, V., et al., Frequency detector for fast frequency lock of digital PLLs, Electronics Letters, Jan. 4, 2007, vol. 43, No. 1, 2 pages, IEEE, Piscataway, United States.
Pottbacker, Ansgar et al., A Si Bipolar Phase and Frequency Detector IC for Clock Extraction up to 8 Gb/s, IEEE Journal of Solid-State Circuits, vol. 27, No. 12, Dec. 1992, 5 pages, IEEE, Piscataway, United States.

* cited by examiner

REFERENCE-LESS CLOCK AND DATA RECOVERY CIRCUIT

TECHNICAL FIELD

Embodiments presented in this disclosure generally relate to recovering data from received signals, and more specifically, to recovering data using reference-less clock and data recovery (CDR) circuits.

BACKGROUND

Optical interconnects are replacing electrical interconnect because of their higher data transfer rate and reduced power consumption. To recover transmitted data, optical transceivers include a CDR circuit whose function is to extract and retime the incoming data at an appropriate phase. The CDR circuit ensures that the original data, which becomes distorted while passing through an electrical channel, is recovered error free. To extract the original data, a reference clock is either supplied to the CDR circuit from an external circuit or is extracted from the data itself by the CDR circuit (i.e., a reference-less CDR circuit). In many electrical applications such as a chip-to-chip or board-to-board transceiver, a local clock is readily available to the CDR circuit. However, in compact optical modules, space and power constraints may mean a reference clock is not available, and thus, a reference-less CDR circuit must be used.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DESCRIPTION OF EXAMPLE EMBODIMENTS

Overview

One embodiment presented in this disclosure is a reference-less clock and data recovery circuit. The circuit includes a frequency locking loop (FLL) comprising a frequency detector configured to generate a first control signal based on a frequency difference between a received data signal and a recovered clock. The FLL is configured to generate a second control signal to deactivate the FLL and activate a phase locking loop (PLL) upon determining the FLL is in a locked state. The PLL comprises a phase detector configured to generate a third control signal based on a phase difference between the received data signal and the recovered clock. The circuit includes an oscillator configured to adjust the recovered clock based on the first and third control signals.

Another embodiment presented in this disclosure is an integrated circuit that includes a FLL comprising a frequency detector configured to generate a first control signal based on a frequency difference between a received data signal and a recovered clock, where the FLL is configured to generate a second control signal to deactivate the FLL and activate a PLL upon determining the FLL is in a locked state. The PLL comprises a phase detector configured to generate a third control signal based on a phase difference between the received data signal and the recovered clock. The integrated circuit includes an oscillator configured to adjust the recovered clock based on the first and third control signals.

Another embodiment presented in this disclosure is a method. The method includes generating, using a FLL, a first control signal based on a frequency difference between a received data signal and a recovered clock. Upon determining the FLL is in a locked state, the method includes generating a second control signal in the FLL that deactivates the FLL and activates a PLL. The method includes generating, using the PLL, a third control signal based on a phase difference between the received data signal and the recovered clock and adjusting the recovered clock based on the first and third control signals.

EXAMPLE EMBODIMENTS

Embodiments herein describe a reference-less CDR circuit that receives electrical signals that may have been transmitted along either an electrical or optical interconnect which are then processed to extract the original data—i.e., the data that was transmitted along the interconnect. To do so, the CDR circuit includes a frequency locking loop (FLL) and a phase locking loop (PLL) which generate control signals for a voltage controlled oscillator (VCO). In one embodiment, the FLL generates a coarse adjustment signal which the VCO uses to output a recovered clock that substantially matches the frequency of the received electrical signal. The PLL, on the other hand, generates a fine adjustment signal which the VCO uses to make small adjustments (e.g., half cycle phase shifts) to the recovered clock. The recovered clock outputted by the VCO is then fed back and used as an input into both the FLL and the PLL.

In one embodiment, the FLL and the PLL are not active simultaneously. For example, when a receiver containing the reference-less CDR is first powered on or first begins receiving electrical signals, the FLL is active while the PLL is inactive. Upon determining the recovered clock substantially matches the frequency of the received electrical signal, the FLL generates a lock signal which deactivates (i.e., breaks) the loop of the FLL and activates the PLL. In one embodiment, the PLL includes a phase detector which uses the received electrical signals and the recovered clock to begin outputting recovered data which matches the original data transmitted to the receiver. Moreover, the PLL can make fine tune adjustments to the recovered clock to account for drift and electrical losses.

Figure 1:
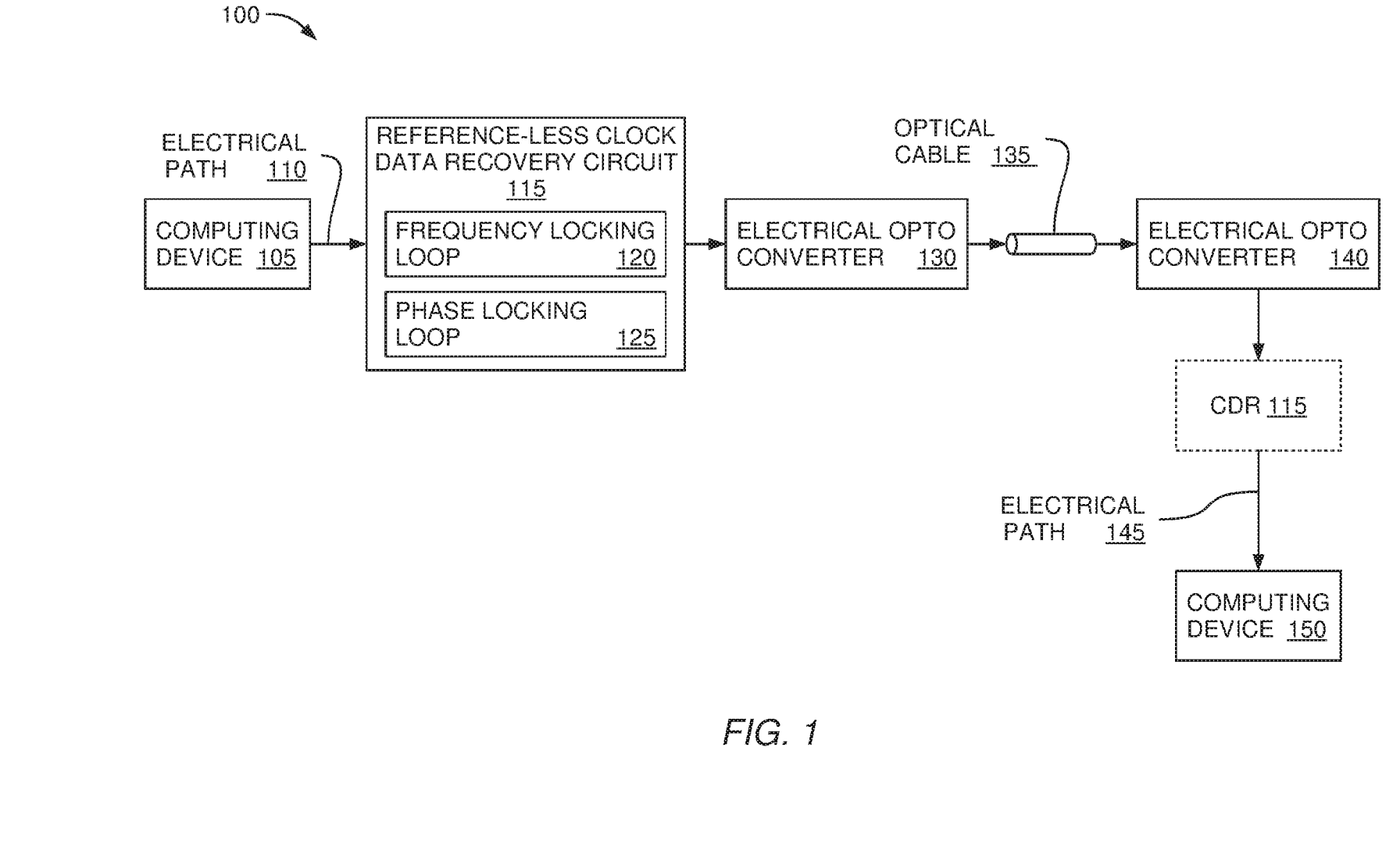
FIG. 1 is a block diagram of a data transmission system, according to one embodiment presented herein.

FIG. 1 is a block diagram of a data transmission system 100, according to one embodiment presented herein. The system 100 includes a computing device 105 that transmits digital data to a receiving computing device 150. The computing devices may be, for example, servers, desktop computers, and the like. Although system 100 illustrates communicatively coupling the computing devices 105 and 150 uses wires (e.g., electrical and optical cables), the embodiments herein may also be used in wireless data communication systems.

The computing device 105 transmits digital data along an electrical path 110 to a reference-less CDR circuit 115. Because the electrical path 110 can introduce noise into the digital data, the CDR circuit 115 performs an operation to recover the data—i.e., mitigate the noise in the data. The reference-less CDR circuit 115 receives the signals propagated along path 110 and outputs recovered data which, assuming no errors, represents the data that was originally outputted by the computing device 105. To recover the data, the CDR circuit 115 includes a frequency locking loop (FLL) 120 and a phase locking loop (PLL) 125. Both the FLL 120 and PLL 125 generate control signals for adjusting an oscillator (shown and described below with respect to FIG. 2) that generates a recovered clock. That is, because circuit 115 is a reference-less CDR circuit, this means an external clock signal is not provided to it. Instead, the CDR circuit 115 internally generates a clock signal matching the frequency of the received electrical signal. In one embodiment, the control signal generated by the FLL 120 controls the oscillator to adjust the recovered clock until its frequency substantially matches the frequency of the received electrical signal. Once the frequency of the recovered clock is locked to the frequency of the electrical signal, the FLL 120 deactivates and the PLL 125 begins to output the recovered data using the recovered clock. Moreover, the PLL 125 can also adjust the recovered clock using a feedback loop, but these adjustments are typically small—e.g., 200 parts per million frequency difference.

The CDR circuit 115 transmits the recovered data to an electrical opto converter 130 which changes the electrical signals into an optical signal that is propagated along an optical cable 135. An opto electrical converter 140 receives the optical signal and converts the signal back into an electrical signal. The electrical signals are provided to another CDR circuit 115, however, as illustrated by the dotted lines, this circuit 115 is optional. Because little noise may have been introduced into the optical signal, the CDR circuit 115 may not be needed. Assuming the CDR circuit 115 is used, it performs the same function described above and transmits the recovered data along an electrical path 145 to the computing device 150. Of course, a similar communication path shown in FIG. 1 may exist from computing device 150 to computing device 105 to permit device 150 to transmit data to device 105.

Figure 2:
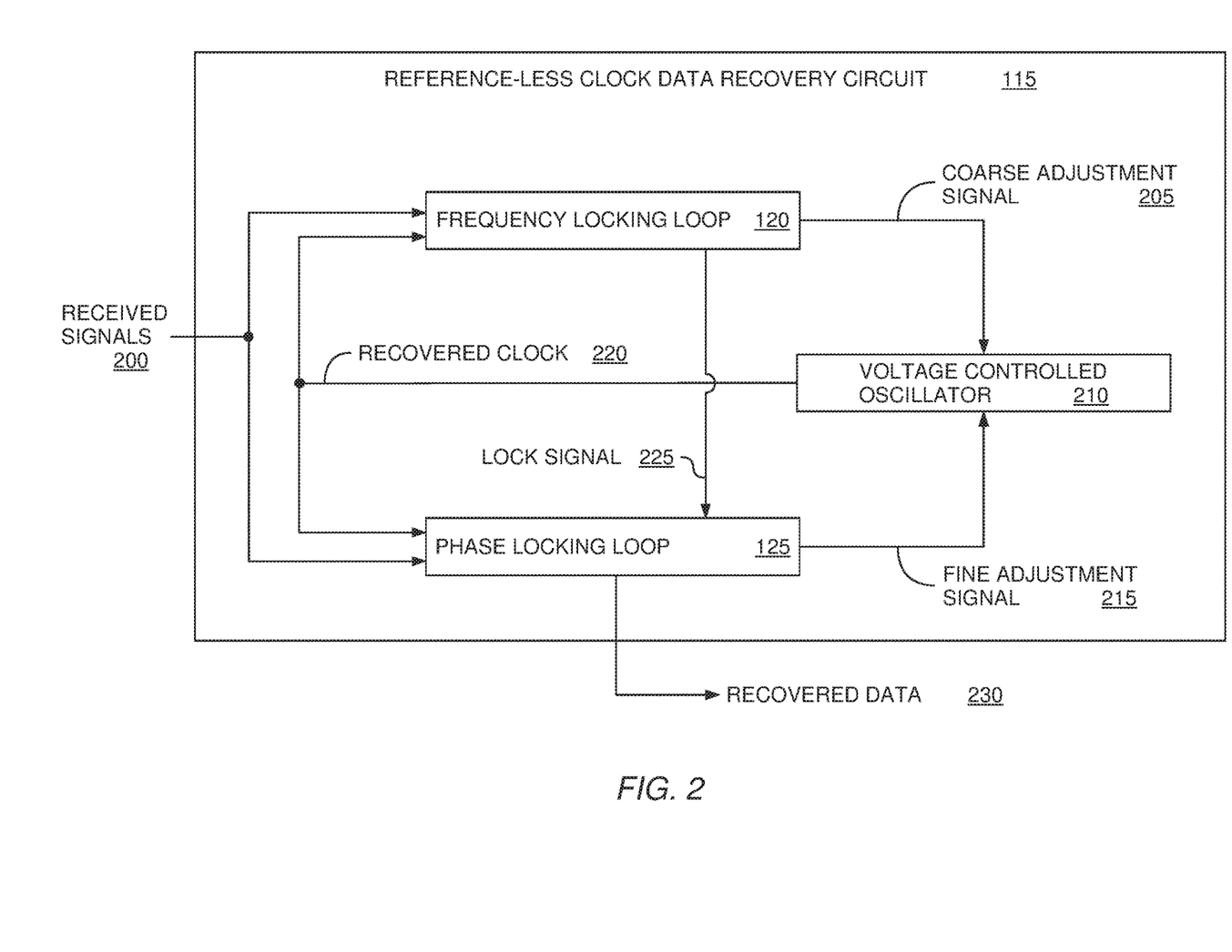
FIG. 2 is a block diagram of a reference-less CDR, according to one embodiment presented herein.

FIG. 2 is a block diagram of the reference-less CDR 115, according to one embodiment presented herein. As shown, received electrical signals 200 are inputted into the CDR 115. Although the electrical signals 200 may be generated from optical signals as shown in FIG. 1, the reference-less CDR 115 can also be used when an electrical interconnect is used to transmit data to the receiver containing the CDR 115.

The received signals 200 serve as an input into both the FLL 120 and the PLL 125. However, in one embodiment, only one of the FLL 120 and PLL 125 is active during any given time. If the FLL 120 is activate, the loop forming the PLL 125 is broken or deactivated so that the control signal generated by the PLL 125 (i.e., a fine adjustment signal 215) does not affect the recovered clock 220 generated by a voltage controlled oscillator (VCO) 210. Conversely, if the PLL 125 is active, the loop forming the FLL 120 is broken or deactivated such that the control signal generated by the FLL 120 (i.e., a coarse adjustment signal 205) does not affect the recovered clock 220.

At startup or when the received signals 200 are first being received, the FLL 120 is active and generates the coarse adjustment signal 205 which defines a voltage for adjusting the recovered clock 220 outputted by the VCO 210. Moreover, the recovered clock 220 is used as an input to the FLL 120 thereby generating a feedback loop. The FLL 120 determines a frequency difference between the recovered clock 220 and the received signals 200. If this frequency difference matches a predefined value—i.e., the frequencies match—the FLL 120 changes a state of a lock signal 225 which deactivates the FLL 120 and activates the PLL 125. For example, the lock signal 225 may cause the FLL 120 to output a zero, or a constant value, as the coarse adjustment signal 205 so that this signal 205 does not change the recovered clock 220. In contrast, the now activated PLL 125 generates the fine adjustment signal 215 which includes a voltage that fine tunes the recovered clock 220. Like the FLL 120, the PLL 125 also uses the recovered clock 220 as an input thereby generating a feedback loop for determining if the phase of the recovered clock 220 should be altered by the VCO 210.

Once activated, the PLL 125 begins outputting the recovered data 230. The recovered data may be transmitted from the receiver containing the CDR circuit 115 to other components in a computing device. For example, the recovered data 230 may be routed using a printed circuit board (PCB) to other components in a computing device.

In one embodiment, a component in the computing device may instruct the CDR circuit 115 to deactivate the PLL 125 and again activate the FLL 120. For example, if an error detection circuit in the computing device determines that the recovered data 230 includes erroneous data, the error detection circuit may assume that the frequencies of the received signals 200 and the recovered clock 220 are no longer locked and instruct the CDR 115 to activate the FLL 120 to again perform coarse adjustments to the recovered clock 220 while the PLL 125 is deactivated.

Figure 3:
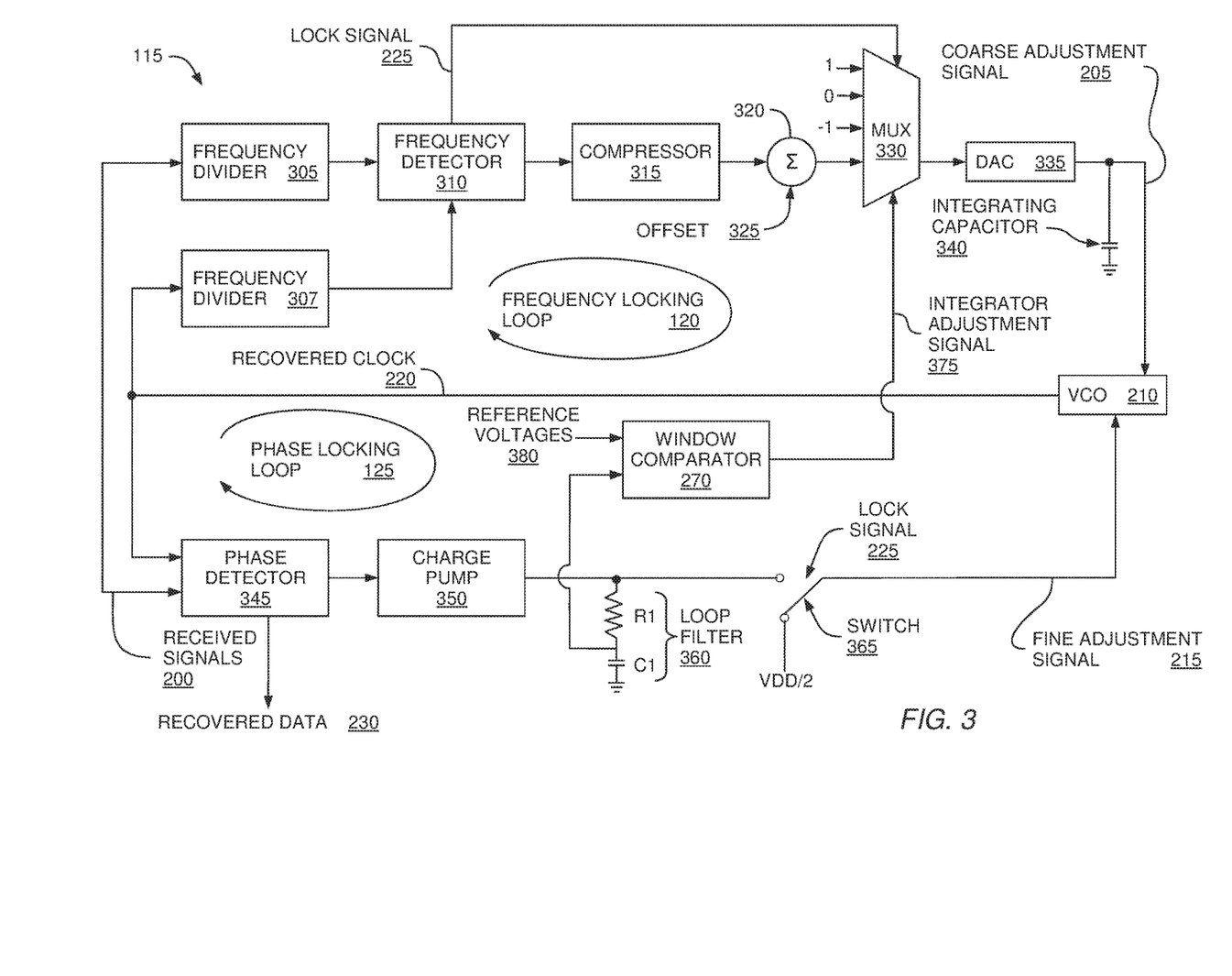
FIG. 3 is a schematic of the reference-less CDR, according to one embodiment presented herein.

FIG. 3 is a schematic of the reference-less CDR circuit 115, according to one embodiment presented herein. In one embodiment, the components in the reference-less CDR 115 are fabricated in an integrated circuit. The CDR circuit 115 illustrates the various components and circuits that form the FLL 120 and the PLL 125. As mentioned above, when the CDR circuit 115 is first powered on, the FLL 120 may be active while the PLL 125 is not. The received signal 200 is routed to a frequency divider 305 which divides the frequency of the received signal 200 by a factor of N. If the received signal 200 is transmitted using a non-return to zero (NRZ) scheme then the equivalent (average) frequency is the data rate divided by four. For example, if the received signal is a NRZ signal with a data rate of 32.76 GHz then the equivalent frequency is 8.19 GHz. Assuming the value of N for the frequency divider 305 is 2^13, then the signal outputted by the divider 305 is approximately 1 MHz. This example is only one example of the data rate and division factor N that may be used.

The frequency divider 307 divides the recovered clock 220 outputted by the VCO 210 by a factor of M. For example, if the recovered clock has a frequency of 16.38 GHz and M is 2^2, the output signal of the frequency divider 307 has a frequency of approximately 4.1 GHz. Both outputs of the frequency divider 305 and 307 are provided to a frequency detector 310 which determines whether the frequency of the recovered clock 220 is in a locked state with the frequency of the received signal 200. Although the details of the frequency detector 310 are described in more detail in FIG. 4, generally, the frequency detector 310 compares the two input signals to determine if the frequencies match. However, as used herein "matched frequencies" does not necessarily mean the data rate of the received signal 200 must be the same as the frequency of the recovered clock 220. For example, continuing the examples above, assuming the data rate of the received signal 200 is 32.76 GHz, the desired frequency of the recovered clock may be 16.38 GHz—i.e., half the data rate of the received signal 200. Once the FLL 120 adjusts VCO 210 such that the recovered clock 220 has a frequency of 16.38 GHz, the output of the frequency detector 310 is zero, thereby indicating that the frequencies of the received signal 200 and clock 220 match. However, if the recovered clock 220 has a frequency that is greater than or less than 16.38 GHz, the frequency detector 310 generates a non-zero output—e.g., a negative output indicates the frequency of the clock 220 is less than the desired frequency 16.38 GHz and a positive output indicates the frequency is more than the desired frequency 16.38 GHz. However, in other embodiments, the CDR 115 may be designed such that the recovered clock 220 has to be equal to the data rate of the received signal 200 in order to achieve the locked state.

Assuming that the frequencies of the received signals 200 and clock 220 do not match—i.e., the FLL 120 is not in a locked state—the non-zero output of the frequency detector 310 is sent to the compressor 315 which minimizes large instantaneous frequency deviations or errors. Over a long observation interval, NRZ random data has a transition probability of 0.5 meaning that it is equally probably that the next bit in the received signals 200 will be a logical one or logical zero. However, deviations may cause the transition probability to move away from 0.5 which can prevent the recovered clock 220 from adjusting to the desired frequency. One way of mitigating the effects of these deviations or errors is to use a long observation interval that includes a plurality of samples. Put another way, evaluating bigger samples of the NRZ random data means it is more likely any frequency deviations will average to a transition probability of 0.5. Changing the observation interval is performed by setting the value N of the frequency divider 305. Larger values of N increase the sample size and reduce the likelihood the transition density of the observed data will deviate from 0.5.

In addition, compressing the output of the frequency detector 310 also minimizes the likelihood of large instantaneous frequency errors affecting the FLL 120 and causing an erroneous change in the recovered clock 220. For example, the compressor 315 may compress a 13 bit digital data word received from the frequency detector 310 into a 6 bit digital value. Thus, deviations in the transition density (which changes the instantaneous frequency of the recovered clock 220) can cause the FLL 120 to introduce jitter into the recovered clock 220. Compressing the output of the frequency detector 310 minimizes the jitter.

In one embodiment, the compressor 315 has a one-to-one (e.g., a linear response) for small inputs and a saturated or compressed response for large inputs. In one embodiment, the compressor 315 uses two states when compressing the data. The first state may be used when the FLL 120 has just begun to operate and the frequency of the received signals 200 is much different than the frequency of the recovered clock 220. For example, if value of the data outputted by the frequency detector is above a threshold, the compressor 315 operates in the first state which responds to large detector values (>256 in this example) by generating a large DAC current. However, after the value is below the threshold, the compressor 315 switches to a second mode of operation where the DAC output saturates at a smaller current value (corresponding to code 16 in this example). Although the compressor 315 can work in only one mode, having two modes of operation (e.g., a non-linear and linear mode) may increase the speed at which the FLL 120 reaches the locked state.

The compressed data is transmitted to a summation circuit 320 which adds an offset 325 to the data. The offset 325 may be added depending on the encoding scheme used to transmit the data in the received signals 200. For example, using a 64 bit/66 bit encoding affects the transition density of the data differently than a pseudorandom binary sequence (PRBS) encoding scheme such as PRBS-7. The offset 325 may change according to the particular encoding scheme used. In one embodiment, the offset 325 may be set once or may change dynamically if the encoding scheme changes. For purely random data the offset can be zero.

The output of the summation circuit 320 is sent to a multiplexer (mux) 330. As shown, the lock signal 225 generated by the frequency detector 310 is used as a select line to determine which input of the mux 330 is selected as its output. In this example, if the FLL 120 is active and not in a locked state, the frequency detector 310 generates a lock signal 225 to select the output of the summation circuit 320 (i.e., the compressed data) as the output of the mux 330. As such, the compressed data is transmitted to a digital to analog converter (DAC) 335 which generates an analog current signal from the digital compressed data. One advantage of compressing the data outputted from the frequency detector 310 is that the DAC 335 may be smaller and consume less power. For example, without data compression, the DAC 335 would need to be large enough to convert, e.g., the 13 bits outputted from the detector 310 rather than only the 6 bits outputted by the compressor 315.

The analog current outputted by the DAC 335 is then integrated by an integrating capacitor 340 to generate a voltage signal—i.e., the coarse adjustment signal 205— which is used as a coarse input to the VCO 210. In one embodiment, as the voltage of the coarse adjustment signal 205 increases, the frequency of the recovered clock 220 generated by the VCO 210 increases. Conversely, as the voltage of the coarse adjustment signal 205 decreases, the frequency of the recovered clock 220 decreases.

The adjusted recovered clock 220 is then fed back to the frequency divider 307 and the FLL 120 operation repeats. In one embodiment, the FLL 120 continues to adjust the recovered clock 220 until the output of the frequency detector 310 is within a small window around zero. Put differently, the FLL 120 remains activate until the frequency of the received signals 200 matches the frequency of the recovered clock 220. In this example, the frequency of the recovered clock 220 should be half the data rate of the received signals 200. In one embodiment, the frequency detector 310 may wait several cycles before determining that the received signals 200 and the recovered clock 220 are in a locked state. In other words, the frequency detector 310 may wait until its output stays within the window for several cycles before determining the frequencies are now locked.

Once the frequencies match and the FLL 120 is in a locked state, the frequency detector 310 changes the state of the lock signal 225 such that the mux 330 no longer outputs the compressed data, but instead, outputs a constant—e.g., zero. Doing so deactivates the FLL 120 and breaks the feedback loop. That is, even if the frequency detector 310 later identifies a mismatch between the frequencies, its output is blocked by the mux 330, and thus, cannot change the recovered clock 220. In one embodiment, the lock signal 225 changes the output of the mux to the zero input, which is constant. As such, the DAC 335 outputs no current and the voltage at the integrating capacitor 340 is fixed at whatever voltage is across the capacitor 340 when the locked state is achieved. Thus, the coarse adjustment signal 205 no longer changes the recovered clock 220.

In addition to deactivating the FLL 120, in this embodiment, the lock signal 225 activates the PLL 125. For example, while the FLL 120 is active, the lock signal 225 controls a switch 365 which couples the fine adjustment signal 215 to a constant reference voltage—e.g., VDD/2. While the FLL 120 is active, the lock signal 225 couples a fine tuning input of the VCO 210 to the reference voltage which ensures this input does not affect the recovered clock 220. However, once the lock signal 225 changes state and breaks the loop formed by the FLL 120, this change in state also alters the state of switch 365 to couple the VCO 210 to the components in the PLL 125 thereby closing the loop and activating the PLL 125. In this manner, the same signal used to deactivate the FLL 120 can be used to activate the PLL 125. Although the embodiments above describe activating the FLL 120 and PLL 125 during non-overlapping time periods, this is not a requirement. However, if the FLL 120 and PLL 125 are activated simultaneously—i.e., both are adjusting the recovered clock 220 in parallel—the coarse adjustment signal 205 and the fine adjustment signal 215 can move in opposite directions until one of these signals saturates at which time one or both the FFL 120 and the PLL 125 are broken. To prevent this scenario the FLL 120 is disabled when the PLL 125 is on and vice versa. An additional advantage of disabling the FLL 120 while the PLL 125 is on is that any jitter caused by the instantaneous transition density variations of the data is not present on the recovered clock 220.

The PLL 125 includes a phase detector 345 which uses both the received signals 200 and the recovered clock 220 as inputs. As discussed below, the recovered clock 220 is preferably phase shifted relative to the received signals 200 such that the transitions in the recovered clock 220 occur in the middle of the data cycles in the received signals 200. Advantageously, having the clock 220 and the signals 200 aligned in this manner increase the chance that the CDR 115 correctly identifies the data carried in the received signals 200. The phase detector 345 outputs the recovered data 230 which should represent the same data transmitted to the receiver. In one embodiment, the phase detector 345 is implemented using a non-linear phase detector (e.g., a bang-bang phase detector or an Alexander phase detector) that outputs a two bit signal indicating a whether the frequency of the recovered clock 220 is correct, whether it should be slowed down, or whether it should be sped up in order to achieve the desired phase difference with the received signals 200. The phase detector 345, however, can also be used with a linear phase detector that outputs a precise measurement of the phase difference between the signals.

If the phases of the received signals 200 and the recovered clock 220 are misaligned such that the transitions of the clock 220 are not in the middle of the data cycles, the phase detector 345 outputs an error signal to a charge pump 350 which outputs a voltage that corresponds to the error signal. Because the switch 365 is closed thereby connecting the output of the charge pump 350 to the VCO 210, the voltage generated by the charge pump 350 is the fine adjustment signal 215 which adjust the frequency of the recovered clock 220 and changes the phase of the clock 220 relative to the received signals 200. In one embodiment, the fine adjustment signal 215 adjusts the frequency to perform at most a half cycle phase shift between the recovered clock 220 and the received signals 200, and as such, is referred to herein as fine tuning the VCO 210. Like in the FLL 120, the recovered clock 220 is fed back to the phase detector 345 to close the PLL 125.

While the PLL 125 is activated, the voltage across the integrating capacitor 340 is intended to remain constant so the coarse adjustment signal 205 does not alter the VCO 210. However, because the integrating capacitor 340 is an analog integrator, eventually the charge on the capacitor 340 begins to bleed off and eventually gets clamped at VDD or ground. To prevent this, the PLL 125 includes a window comparator 370 that monitors the voltage across a capacitor in a loop filter 360. The PLL 125 monitors the voltage across the capacitor C1 in the loop filter 360 using the window comparator 370. Specifically, the voltage across the capacitor C1 should be in the vicinity of VDD/2. The window comparator 370 compares the voltage across capacitor C1 to two reference voltages 380 (e.g., VDD/2+25 mV and VDD/2-25 mV).

Based on this comparison, the window comparator 370 outputs an integrator adjustment signal 375 to control the mux 330. Specifically, the integrator adjustment signal 375 selects between the constant inputs 1, 0, and -1 of the mux 330. If the voltage on the capacitor C1 is between the reference voltages 380 (i.e., is between VDD/2+25 mV and VDD/2-25 mV), the integrator adjustment signal 375 selects the 0 input as the output of the mux 330 which means the DAC 335 does not output any current and the voltage across the integrating capacitor 340 remains the same. However, if the voltage on the capacitor C1 is below VDD/2 by more than 25 mV, the integrator adjustment signal 375 causes the mux 330 to output 1. This value causes the DAC 335 to source current which increases the voltage on the integrating capacitor 340. Conversely, if the voltage on the capacitor C1 is greater than VDD/2 by more than 25 mV, the integrator adjustment signal 375 causes the mux 330 to output -1. This value causes the DAC 335 to sink current which decreases the voltage on the integrating capacitor 340. In this manner, the PLL 125 can stabilize the voltage across the integrating capacitor 340 so that the coarse adjustment signal 205 does not drift all the way to VDD or ground 125.

Although not shown, the receiver may include other circuitry or firmware/software that monitors the recovered data 230 to determine if the data 230 includes errors. If, for example, the errors exceed a threshold number in a predetermined time, the receiver may reset the CDR 115 by changing the state of the lock signal 225 so that the FLL 120 is again active and the PLL 125 is inactive. Specifically, changing the state of the lock signal 225 changes the switch 365 to couple VCO 210 to VDD/2, thereby breaking the loop formed by the PLL 125. Furthermore, the lock signal 225 controls the mux 330 such that the outputs of the frequency detector 310 and the compressor 315 are sent to the DAC 335 instead of the constant inputs selected using the integrator adjustment signal 375.

Figure 4:
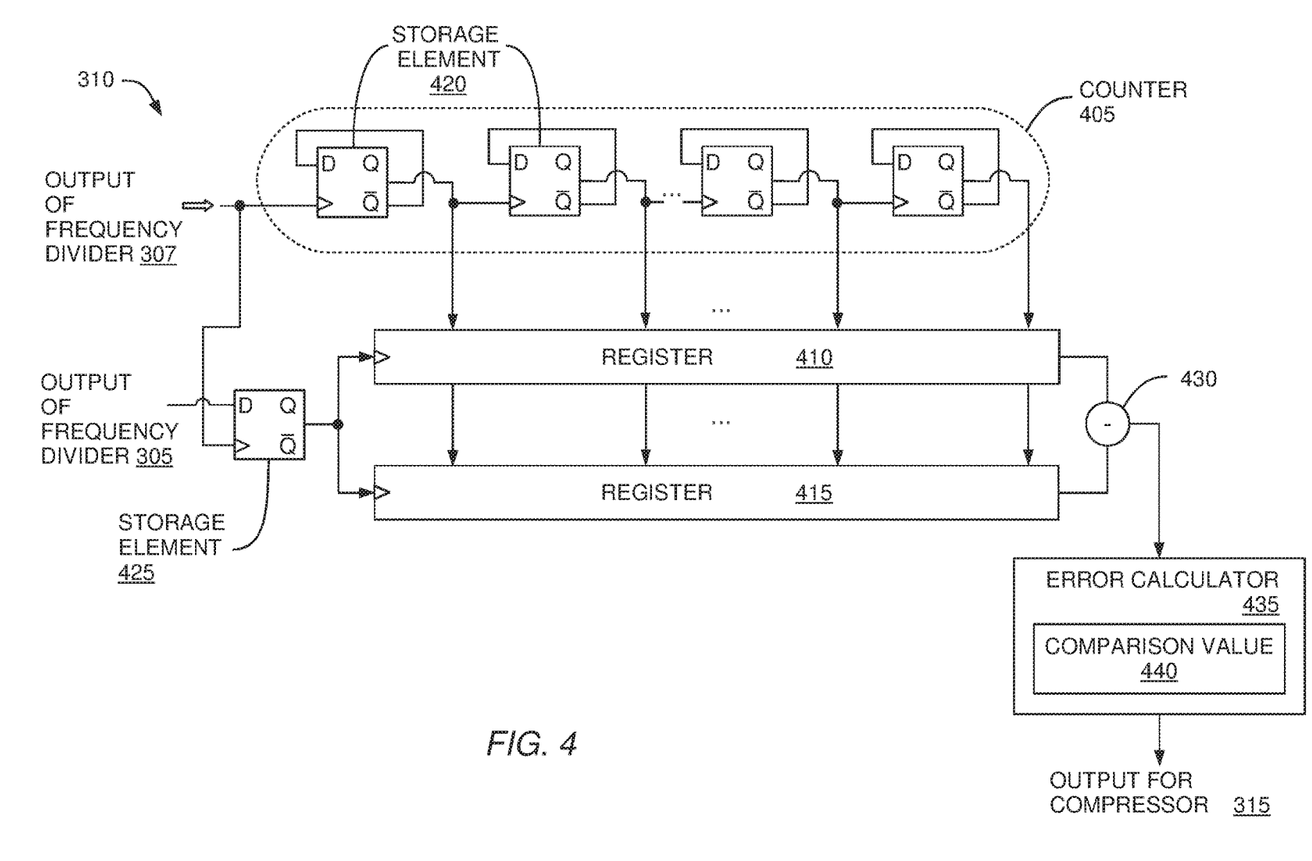
FIG. 4 is the circuitry of a frequency detector illustrated in FIG. 3, according to one embodiment described herein.

FIG. 4 is the circuitry of the frequency detector 310 illustrated in FIG. 3, according to one embodiment described herein. The frequency detector 310 includes a counter 405, a register 410, a register 415, and error calculator 435. The counter 405 includes a plurality of chained storage elements 420 (e.g., flip-flops or latches) which generates a count according to the transitions in the signal outputted by the frequency divider 307. Referring back to FIG. 3, the output of the divider 307 is the recovered clock 220 divided by M. Assuming M is 2^4 and the recovered clock is 16.38 GHz, the output of the frequency divider 307 is approximately 4.096 GHz which is the rate at which the counter 405 increments.

The registers 410 and 415 are clocked using the output of the frequency divider 305 shown in FIG. 3. As such, each time the output signal of the divider 305 has a rising transition, the register 415 stores the current value of register 410, while register 410 is updated to store the current count value of the counter 405. Assuming the data rate of the received signal 200 is 32.77 GHz and the divider 305 divides this rate by 2^13, the output of the frequency divider 305 is 1 MHz. As such, the registers 410 and 415 are updated with new data every 1 millionth of a second. In this example, the output of frequency divider 305 is first fed into the storage element 425 which helps to synchronize this signal to the scaled clock signal outputted by the frequency divider 307.

To explain the function of frequency detector 310, assume the recovered clock is already synchronized to half the data rate of the received signal (i.e., the output of frequency divider 307 is 4.096 GHz) and the value of counter 405 is zero. Thus, when the output of the frequency divider (which is a 1 MHz signal) transitions after a first time period, the value of the counter 405 is approximately 4,096 which is stored in register 410. When the 1 MHz signal transitions again after a second time period, the value of the counter 405 is now 8,192. In response, the register 415 stores the old value of register 410 (i.e., 4,096) while the register 410 stores the current value of the counter 405 (i.e., 8,192). Moreover, the values of the registers 410 and 415 are transmitted to a subtraction circuit 430 which subtracts the value of register 410 from register 415, which in this case is 4,096. This value is sent to the error calculator 435 which compares the value to a predefined comparison value 440. In this case, because the frequency of the recovered clock should be half of the data rate, the comparison value 440 is 4,096. Because the value outputted by the subtraction circuit 430 equals the comparison value 440, the error calculator 435 determines no adjustment is needed and sends a zero value digital signal to the compressor 315.

If the example above is repeated, but now the output of the frequency divider 307 is 4.095 GHz (i.e., the recovered clock and the received signals are not synchronized), then after the first time period the counter value of 4,095 is stored in register 410. After the second time period, the value of 4,095 is stored in the register 415 while a counter value of 8,190 is stored in register 410. When subtracted, the result is 4,095 which is sent to the error calculator 435. Because 4,095 is different than the 4,096 comparison value 440, the error calculator 435 transmits a non-zero digital value (e.g., −1) to the compressor thereby indicating the VCO should adjust the recovered clock signal.

In one embodiment, the counter 405 includes an extra bit to provide additional headroom to adjust the recovered clock signal when this signal is greater than the desired frequency. Continuing the example above, if the recovered clock signal was 5 GHz but the counter 405 included only twelve storage elements, the maximum value of the count would be 4096. Thus, a 5 GHz output of the frequency divider 307 means that the 1 MHz signal would not transition until after the counter 405 had rolled over. Put differently, instead of storing a count of 5,000, the counter 405 would be at 904 which means the frequency detector 310 would behave as if the output of the divider 307 is at 905 kHz rather than 5 GHz. However, if another stage is added to the counter 405 so it can store a count value up to 2^13 (8,192), this provides additional headroom for instances where the recovered clock may exceed its desired frequency (up to 100% in this example). Of course, the number of stages in the counter 405 will depend on the data rate of the received data, the desired frequency of the recovered clock (e.g., whether the clock is a full data rate clock, half data rate clock (as in this case), or a quarter data rate clock), and the division factors N and M for the frequency dividers 305 and 307. One embodiment of the frequency detector 310 shown in FIG. 4 is described in *Frequency Detector for Fast Frequency Lock of digital PLLs* authored by V. Kratyuk, P. K. Hanumolu, U.-K. Moon and K. Mayaram published on 24 Oct. 2006 in *Electronics Letters* online no: 20073292 which is herein incorporated by reference. However, the frequency detector 310 described there is just one example of a suitable detector for implementing the reference-less CDR 115.

Figure 5:
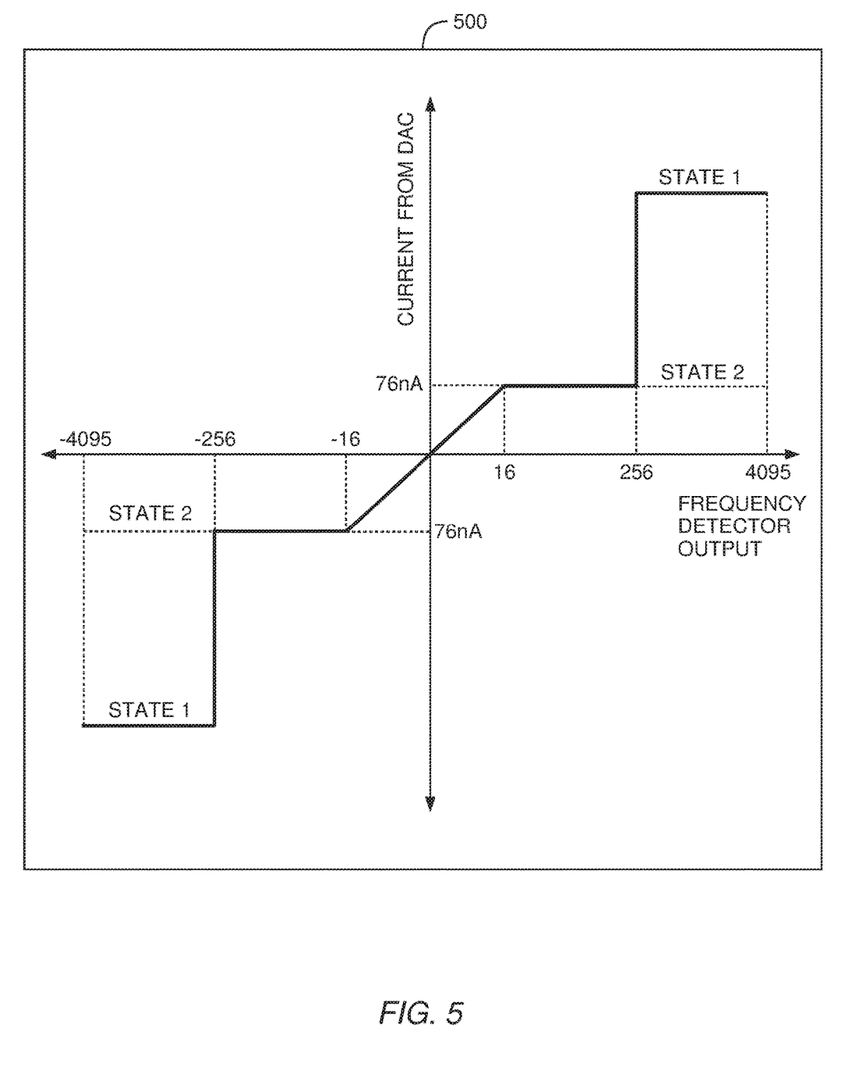
FIG. 5 is a chart illustrating outputs of circuit elements illustrated in FIG. 3, according to one embodiment described herein.

FIG. 5 is a chart 500 illustrating the output of the DAC 335 in FIG. 3, according to one embodiment described herein. The x-axis of chart 500 illustrates the value of the digital error signal outputted by the frequency detector 310 in FIGS. 3 and 4, while the y-axis is the corresponding value of the DAC 335. 120As shown, for values emitted by the frequency detector 310 that have an absolute value greater than 16, the compressor 315 operation is non-linear. Specifically, while in State 1, the compressor 315 maps output values of the frequency detector 310 greater than 256 to a first constant output (corresponding to a DAC output of +/−2.5 micro amps) and output values between 16 and 256 to a second constant output (corresponding to a DAC output of +/−76 nano amps). In State 2, for all codes greater than +/−16, the output of the DAC is held at +/−76 nA. However, when the digital output values of the frequency detector 310 are between −16 and 16, the operation of the compressor 315 is linear so that the output of the DAC 335 changes proportionally to the output of the frequency detector 310.

One advantage of using two modes of operation in the compressor 315 is that the non-linear mode can be used to quickly adjust the recovered clock to be within the linear region (i.e., −16 to 16). Moreover, by mapping multiple values of the output of the frequency detector 310 to the same output value of the compressor 315 means that the compressor 315 can reduce the range of values inputted into the DAC 335, thereby reducing the complexity and cost of the DAC 335.

In one embodiment, when the FLL achieves the locked state the output of the DAC 335 is governed by a control signal provided by the PLL (e.g., the integrator adjustment signal 375). As shown in FIG. 3, the input of the DAC 335 is a positive constant value (e.g., 1), a negative constant value (e.g., −1), or zero. Thus, the output of the DAC 335 changes according to which of the values is selected by the control signal from the PLL. For example, the positive constant value may correspond to −76 nA, the negative constant value corresponds to the 76 nA, and the zero value corresponds to zero current.

Figure 6:
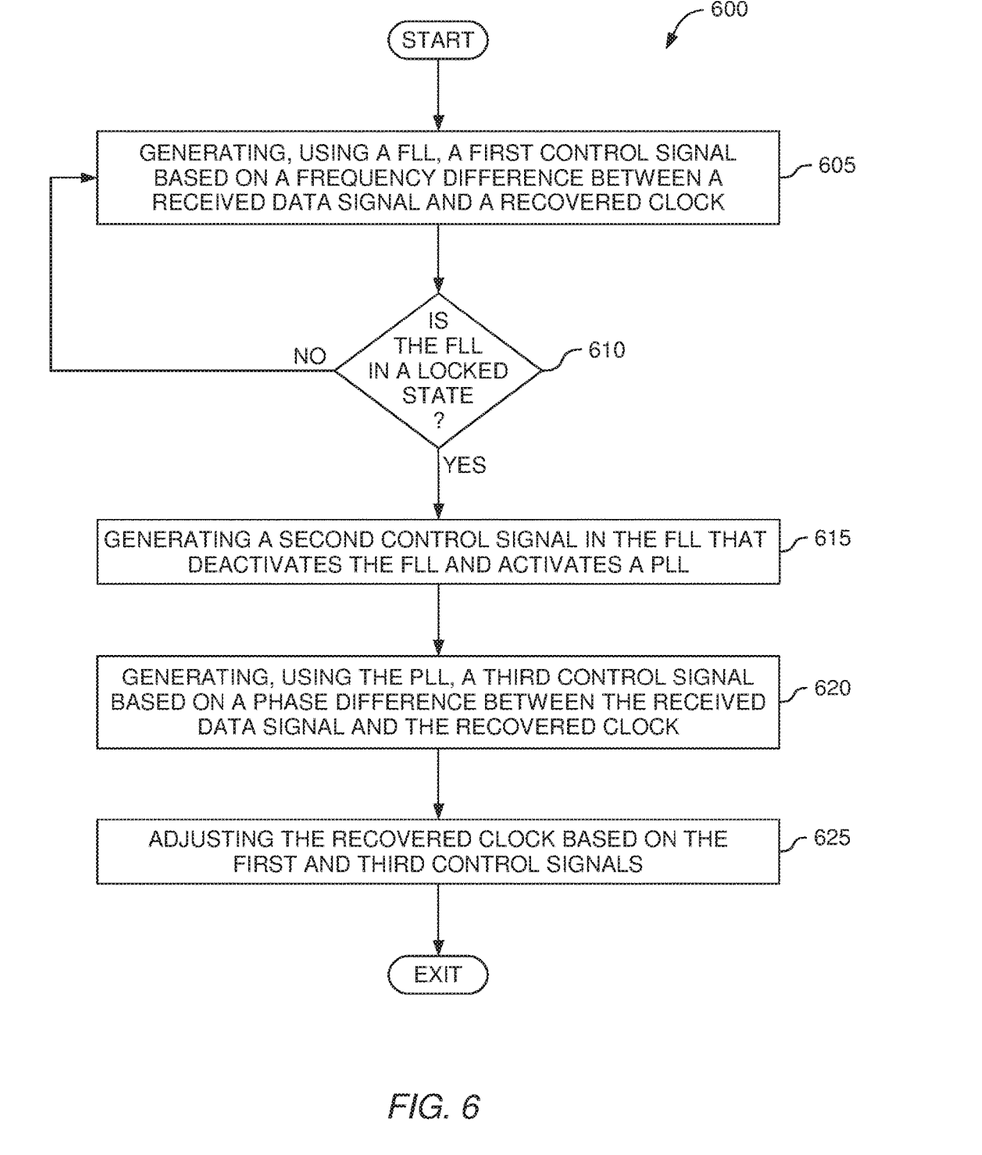
FIG. 6 illustrates a flowchart for operating a reference-less CDR circuit, according to one embodiment described herein.

FIG. 6 illustrates a flowchart of a method 600 for operating a reference-less CDR circuit, according to one embodiment described herein. Method 600 begins at block 605 where the FLL generates a first control signal based on a frequency difference between a received data signal and a recovered clock. Referring to FIG. 3, in one embodiment, the first control signal is the output of the frequency detector 310 which compares the frequencies of signals derived from dividing the received signals 200 and the recovered clock 220 by the frequency dividers 305 and 307.

At block 610, the frequency detector determines whether the FLL is in a locked state. Although this function is shown in FIG. 3 as being performed by the frequency detector which outputs the lock signal, in other embodiments, the compressor may determine if the output of the frequency detector indicates the FLL is in the locked state. Further still, in one embodiment, a circuit external to the FLL or the CDR circuit may use the output of the frequency detector to determine if the frequency of the received signals substantially matches the frequency of the recovered clock over a plurality of cycles.

If the FLL is not in the locked state, method 600 returns to block 605 where the FLL continues to adjust the recovered clock until the locked state is achieved. Assuming the locked state is achieved, at block 615, the FLL generates a second control signal that deactivates the FLL and activates the PLL. In one example, the second control signal is the lock signal generated by the frequency detector. However, this signal may be generated by other circuits either in the CDR or external to it.

At block 620, the PLL generates a third control signal based on a phase difference between the received data signal and the recovered clock. In one example, the third control signal is the output of the phase detector 345 shown in FIG. 3 which compares the phases of the recovered clock 220 and the received signals 200.

At block 625, the CDR adjusts the recovered clock based on the first and second control signals. In one embodiment, the recovered clock is adjusted by only one of the controls at a time. For example, if the FLL is currently active, then the CDR circuit adjusts the recovered clock using the first control signal, while the third control signal is either not transmitted to the VCO or is held at a constant voltage. Conversely, if the PLL is currently active, the CDR circuit adjusts the recovered clock using the third control signal, while the first control signal is either not transmitted to the VCO or is held at a constant voltage.

In the preceding, reference is made to embodiments presented in this disclosure. However, the scope of the present disclosure is not limited to specific described embodiments. Instead, any combination of the features and elements described herein, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the aspects, features, embodiments and advantages are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

The flowchart and block diagrams in the Figures illustrate the architecture, functionality and operation of possible implementations of systems and methods according to various embodiments. In this regard, each block in the flowchart or block diagrams may represent a module or segment which comprises one or more circuits for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

In view of the foregoing, the scope of the present disclosure is determined by the claims that follow.

We claim:

1. A reference-less clock and data recovery (CDR) circuit, comprising:
    a frequency locking loop (FLL) comprising a frequency detector configured to generate a first control signal based on a frequency difference between a received data signal and a recovered clock, wherein the FLL is configured to generate a second control signal to deactivate the FLL and activate a phase locking loop (PLL) upon determining the FLL is in a locked state, wherein the FLL comprises:
        a compressor configured to compress a digital value represented by the first control signal and switch between two modes of operation based on a difference between the received data signal and the recovered clock as measured by the frequency detector,
        a digital-to-analog converter (DAC) configured to output a current based on the compressed digital value, and
        an analog integrator;
    the PLL comprising a phase detector configured to generate a third control signal based on a phase difference between the received data signal and the recovered clock; and
    an oscillator configured to adjust the recovered clock based on the first and third control signals, wherein the analog integrator is configured to receive the current and output a voltage for driving the oscillator in order to adjust the recovered clock.

2. The CDR circuit of claim 1, wherein the PLL is inactive when the FLL is active and the FLL is inactive when the PLL is active.

3. The CDR circuit of claim 2, wherein the frequency detector in the FLL generates the second control signal, and wherein the FLL further comprises selection logic which breaks a loop formed by the FLL in response to the second control signal indicating the FLL is in the locked state, and wherein the PLL further comprises a switch activated by the second control signal, wherein the switch transmits a constant voltage to the oscillator when the PLL is deactivated.

4. The CDR circuit of claim 1, wherein the FLL comprises:
    a first frequency divider configured to divide the received data signal by a first predefined value; and
    a second frequency divider configured to divide the recovered clock by a second predefined value,
    wherein respective outputs of the first and second frequency dividers are inputs for the frequency detector.

5. A reference-less clock and data recovery (CDR) circuit, comprising:
    a frequency locking loop (FLL) comprising a frequency detector configured to generate a first control signal based on a frequency difference between a received data signal and a recovered clock, wherein the FLL is configured to generate a second control signal to deactivate the FLL and activate a phase locking loop (PLL) upon determining the FLL is in a locked state, wherein the FLL comprises:
  a compressor configured to compress a digital value represented by the first control signal,
  a digital to analog converter (DAC) configured to output a current based on the compressed digital value, and
  an analog integrator;
the PLL comprises a phase detector configured to generate a third control signal based on a phase difference between the received data signal and the recovered clock and a comparator configured to output an integrator adjustment signal to control an input of the DAC when the PLL is active and the FLL is inactive, wherein the integrator adjustment signal causes the DAC to at least one of increase and decrease charge across a capacitor in the analog integrator; and
an oscillator configured to adjust the recovered clock based on the first and third control signals, wherein the analog integrator is configured to receive the current and output a voltage for driving the oscillator in order to adjust the recovered clock.

6. The CDR circuit of claim 5, wherein the integrator adjustment signal is based on comparing a value derived from the phase difference between the received data signal and the recovered clock to a predefined reference value.

7. A reference-less clock and data recovery (CDR) circuit, comprising:
  a frequency locking loop (FLL) comprising a frequency detector configured to generate a first control signal based on a frequency difference between a received data signal and a recovered clock, wherein the FLL is configured to generate a second control signal to deactivate the FLL and activate a phase locking loop (PLL) upon determining the FLL is in a locked state;
  the PLL comprises:
    a phase detector configured to generate a third control signal based on a phase difference between the received data signal and the recovered clock,
    a charge pump coupled to the phase detector to receive the third control signal, and
    a loop filter coupled to the charge pump and configured to output a control voltage for adjusting an analog integrator in the FLL; and
  an oscillator configured to adjust the recovered clock based on the first and third control signals, wherein the charge pump is configured to output a fine adjustment signal for controlling the oscillator.

8. An integrated circuit, comprising:
  a frequency locking loop (FLL) comprising a frequency detector configured to generate a first control signal based on a frequency difference between a received data signal and a recovered clock, wherein the FLL is configured to generate a second control signal to deactivate the FLL and activate a phase locking loop (PLL) upon determining the FLL is in a locked state;
  the PLL comprising:
    a phase detector configured to generate a third control signal based on a phase difference between the received data signal and the recovered clock
    a charge pump coupled to the phase detector to receive the third control signal, and
    a loop filter coupled to the charge pump and configured to output a control voltage for adjusting an analog integrator in the FLL; and
  an oscillator configured to adjust the recovered clock based on the first and third control signals, wherein the charge pump is configured to output a fine adjustment signal for controlling the oscillator.

9. The integrated circuit of claim 8, wherein the PLL is inactive when the FLL is active and the FLL is inactive when the PLL is active.

10. The integrated circuit of claim 9, wherein the frequency detector in the FLL generates the second control signal, and wherein the FLL further comprises selection logic which breaks a loop formed by the FLL in response to the second control signal indicating the FLL is in the locked state, and
  wherein the PLL further comprises a switch activated by the second control signal, wherein the switch transmits a constant voltage to the oscillator when the PLL is deactivated.

11. The integrated circuit of claim 8, wherein the FLL comprises:
  a compressor configured to compress a digital value represented by the first control signal;
  a DAC configured to output a current based on the compressed digital value; and
  the analog integrator configured to receive the current and output a voltage for driving the oscillator in order to adjust the recovered clock.

12. The integrated circuit of claim 11, wherein the compressor is configured to switch between two modes of operation based on a difference between the received data signal and the recovered clock as measured by the frequency detector.

13. The integrated circuit of claim 11, wherein the PLL comprises:
  a comparator configured to output an integrator adjustment signal to control an input of the DAC when the PLL is active and the FLL is inactive, wherein the integrator adjustment signal causes the DAC to at least one of increase and decrease charge across a capacitor in the analog integrator.

14. The integrated circuit of claim 13, wherein the integrator adjustment signal is based on comparing a value derived from the phase difference between the received data signal and the recovered clock to a predefined reference value.

15. The integrated circuit of claim 8, wherein the FLL comprises:
  a first frequency divider configured to divide the received data signal by a first predefined value; and
  a second frequency divider configured to divide the recovered clock by a second predefined value,
  wherein respective outputs of the first and second frequency dividers are inputs for the frequency detector.

* * * * *

UNITED STATES PATENT AND TRADEMARK OFFICE
CERTIFICATE OF CORRECTION

PATENT NO. : 9,793,902 B2
APPLICATION NO. : 15/048040
DATED : October 17, 2017
INVENTOR(S) : Kadaba Lakshmikumar et al.

It is certified that error appears in the above-identified patent and that said Letters Patent is hereby corrected as shown below:

In the Specification

In Column 10, Line 15, delete "U.-K." and insert -- U. K. --, therefor.
In Column 10, Line 26, delete "120As" and insert -- As --, therefor.

Signed and Sealed this
Nineteenth Day of December, 2017

Joseph Matal
*Performing the Functions and Duties of the*
*Under Secretary of Commerce for Intellectual Property and*
*Director of the United States Patent and Trademark Office*